United States Patent
Avisse et al.

[19]

[11] Patent Number: 6,098,464
[45] Date of Patent: Aug. 8, 2000

[54] WHEATSTONE BRIDGE WITH TEMPERATURE GRADIENT COMPENSATION

[75] Inventors: Jean-Bernard Avisse, Castelneau-de-Medoc; Jeanine Chiron, Floirac, both of France

[73] Assignee: Societe Nationale d'Etude et de Construction de Moteurs d'Aviation, Paris, France

[21] Appl. No.: 09/077,769

[22] PCT Filed: Dec. 4, 1996

[86] PCT No.: PCT/FR96/01933

§ 371 Date: Jun. 3, 1998

§ 102(e) Date: Jun. 3, 1998

[87] PCT Pub. No.: WO97/21083

PCT Pub. Date: Jun. 12, 1997

[30] Foreign Application Priority Data

Dec. 4, 1995 [FR] France ................. 95 14295

[51] Int. Cl.[7] .............. G01L 19/04; G01L 9/04; G01R 27/04; G01R 27/08

[52] U.S. Cl. .............. 73/708; 73/720; 324/720; 324/648

[58] Field of Search .............. 324/610, 648, 324/657, 666, 673, 683, 706, 725, 720, 721; 73/720, 721, 726, 727, 708, 765, 766

[56] References Cited

U.S. PATENT DOCUMENTS

| | | | |
|---|---|---|---|
| 3,665,756 | 5/1972 | Russell | 73/88.5 |
| 4,174,639 | 11/1979 | Raven | 73/766 |
| 4,444,056 | 4/1984 | Romo | 73/708 |
| 4,565,097 | 1/1986 | Dimeff . | |
| 4,765,188 | 8/1988 | Krechmery et al. | 73/708 |
| 5,375,474 | 12/1994 | Moore, Sr. . | |
| 5,877,423 | 3/1999 | Mottsson | 73/708 |

FOREIGN PATENT DOCUMENTS

| | | |
|---|---|---|
| 0 584 652 | 3/1994 | European Pat. Off. . |
| 88 15 056 U | 2/1989 | Germany . |

*Primary Examiner*—Max Noori
*Assistant Examiner*—Abdullahi Aw-Musse
*Attorney, Agent, or Firm*—Weingarten, Schurgin, Gagnebin & Hayes LLP

[57] ABSTRACT

The output voltage of a Wheatstone bridge type electrical circuit comprising four main resistances ($J_1$ to $J_4$) having substantially the same ohmic value, R, and substantially the same temperature coefficient of resistance, $\alpha$, is made independent of temperature differences existing between the branches of the bridge by addition, in each of the branches, of a compensation element ($r_1$ to $r_4$) in series with the main resistance, each compensation element being physically located very close to a main resistance situated in one of the adjacent branches of the bridge so as to have the same temperature as that main resistance. The compensation elements have the same ohmic value r and the same temperature coefficient of resistance $\beta$, with $R\alpha = r\beta$, r being less than R and, preferably, $r/R \leq \frac{1}{2}$, so as to limit the loss of sensitivity of the Wheatstone bridge to variations in the resistances of the bridge.

15 Claims, 6 Drawing Sheets

↑ Pressure

Output voltage = $U_S$

Supply voltage = $U_A$

WHEATSTONE BRIDGE WITH TEMPERATURE GRADIENT COMPENSATION

The present invention relates to an electrical circuit of "Wheatstone bridge" type and, more particularly, to such an electric circuit in which there is an automatic compensation for temperature differences existing between the branches of the bridge.

Electrical circuits of Wheatstone bridge type are well known. They are used in many different applications in order to produce an output voltage the variation of which indicates the existence and magnitude of an imbalance between the resistances in the branches of the bridge. Normally, circuits of this type are designed in order to detect imbalances due to the variation of a main parameter with respect to a reference value or due to phenomena which have a different effect on the respective resistances in the different branches of the circuit. Evidently, it is preferable that the behaviour of the circuit should not be affected by other parameters or phenomena such as, for example, ambient temperature.

In theory, in the case of a classic Wheatstone bridge such as is shown in FIG. 1, the output voltage $U_S$, depends on the resistances $R_1$ to $R_4$ of the bridge, and on the supply voltage, $U_A$, in accordance with equation (1) below:

$$U_S = U_A \frac{R_1 R_2 - R_3 R_4}{(R_1 + R_3)(R_2 + R_4)} \quad (1)$$

In practice, the resistances of the elements $R_1$ to $R_4$ vary as a function of the ambient temperature and of the temperature coefficient of resistance (TCR), $\alpha$, when the latter is not negligible. If there is an offset, $\theta_i$, between the temperature of each element $R_i$ and a reference temperature, the theoretical equation (1) is transformed into the equation (2) below:

$$U_S = U_A \frac{R_1(1 + \alpha\theta_1)R_2(1 + \alpha\theta_2) - R_3(1 + \alpha\theta_3)R_4(1 + \alpha\theta_4)}{(R_1(1 + \alpha\theta_1) + R_3(1 + \alpha\theta_3))(R_2(1 + \alpha\theta_2) + R_4(1 + \alpha\theta_4))} \quad (2)$$

(In equation (2) and those that follow, the temperature coefficient of resistance, $\alpha$, is treated as if it were identical for the four elements of the Wheatstone bridge. In practice, it is relatively simple to select the bridge elements so that this simplification is approximately true.

In the case where the four elements $R_i$ of the Wheatstone bridge are all at the same temperature, $\theta$, and the supply voltage is fixed, assuming that $\alpha\theta<<1$, equation (2) is simplified and becomes identical to equation (1). Thus, in such a case, the ambient temperature scarcely affects the behaviour of the Wheatstone bridge. (It is possible, however, that there will be a residual temperature effect on the bridge due, for example, to deformations of the mechanical support on which the differences are located).

In the case where the elements $R_i$ of the Wheatstone bridge are not all at the same temperature, equation (2) conserves certain terms, whose value depends on the local temperature of the elements $R_i$. This effect erodes the precision of the measurement made using the circuit.

The principle of the Wheatstone bridge is used, amongst others, in the field of pressure sensors using strain gauges.

A typical construction of such a pressure sensor is shown diagrammatically in FIG. 2, in which FIG. 2(a) indicates the physical disposition of the strain gauges in the sensor and FIG. 2(b) shows the corresponding electrical circuit. In the sensor of FIG. 2(a), four strain gauges, $J_1$ to $J_4$, are disposed on a deformable membrane, two gauges $J_1$, $J_2$ are in the central region of the membrane and the other two gauges $J_3$, $J_4$ are towards the periphery of the membrane. The strain gauges each have the same electrical resistance, R, at a given temperature and reference pressure. Electrical connections (not shown) are provided between the gauges $J_1$ to $J_4$ and a power supply and output terminals, so as to form a Wheatstone bridge circuit such as shown in FIG. 2(b).

In such a pressure sensor, the membrane deforms by curving outwards under the effect of a pressure applied in the direction of the arrow shown in FIG. 2(a). The strain, due to traction, produced in the central portion of the membrane leads to an increase, $+\Delta R$, in resistance of the gauges $J_1$ and $J_2$, while compression strain is produced in the periphery of the membrane leading to a reduction, $-\Delta R$, in the resistance of gauges $J_3$, $J_4$. If all the gauges are at the same temperature, these resistance variations affect the output voltage of the Wheatstone bridge circuit according to equation (3) below:

$$U_S = U_A(\Delta R/R) \quad (3)$$

This simple relationship enables the variation in resistance to be calculated and, thus, to calculate the pressure applied to the membrane of the sensor.

However, if a temperature gradient exists between the gauges $J_1$ to $J_4$ of the sensor, the equation (4) below applies, which is more complicated:

$$U_S = U_A \frac{(R + \Delta R)(1 + \alpha\theta_1)(R + \Delta R)(1 + \alpha\theta_2) - (R - \Delta R)(1 + \alpha\theta_3)(R - \Delta R)(1 + \alpha\theta_4)}{((R + \Delta R)(1 + \alpha\theta_1) + (R - \Delta R)(1 + \alpha\theta_3))((R + \Delta R)(1 + \alpha\theta_2) + (R - \Delta R)(1 + \alpha\theta_4))} \quad (4)$$

It is clear that such a complicated relationship, which is dependent on the temperatures of the individual gauges, does not enable a precise measurement of the pressure to be made by the sensor.

The document DE-U-88 15 056 describes a load sensor having strain gauges which constitute the main resistances of a Wheatstone bridge type circuit. In each branch of the Wheatstone bridge a supplementary resistance is connected in series with the main resistance. All of the main resistances and all of the supplementary resistances have the same temperature coefficient of resistance and the same ohmic value of resistance.

In this known circuit, each supplementary resistance is physically located in the neighbourhood of one of the main resistances in another branch of the bridge so that effects due to the existence of a temperature gradient between the main resistances of the bridge are compensated by effects produced in the supplementary resistances. Thus, the existence of such a temperature gradient should not affect the output signal of the Wheatstone bridge. However, the way in which this compensation is performed in the Wheatstone bridge of document DE-U-88 15 056 leads to a substantial loss in sensitivity of this sensor. More particularly, the sensitivity of the sensor to variations in resistance occurring in the Wheatstone bridge is reduced by a half.

In view of the problems explained above, the present invention seeks to render the output voltage of a Wheatstone bridge type electrical circuit, constituted by resistances whose TCR is not so close to zero as to be negligible, insensitive to temperature differences existing between these resistances, whilst limiting the loss of sensitivity of the output signal of the circuit to variations in resistance occurring in the bridge.

The present invention also seeks to provide a sensor including a Wheatstone bridge type electrical circuit in which the resistance variations correspond to variations in the parameter to be measured and which is constituted by resistances whose TCR is not negligible, made insensitive to differences in temperature existing between these resistances in a way which enables the sensitivity of the sensor to be maintained.

In order to overcome the problems mentioned above, the present invention provides a Wheatstone bridge type electrical circuit comprising four main resistance elements each having substantially the same ohmic value of resistance, R, and substantially the same value of temperature coefficient of resistance, $\alpha$, a main resistance element being located in each branch of the Wheatstone bridge, wherein each branch of the Wheatstone bridge comprises a compensation element in series with the corresponding main resistance element, the compensation elements each having substantially the same ohmic value of resistance, r, and substantially the same temperature coefficient of resistance, $\beta$, these values being related to those of the main resistance elements substantially according to the formula:

$$R\alpha = r\beta$$

and each of the main resistance elements shares its thermal environment with a compensation element of one of the adjacent branches of the Wheatstone bridge, characterised in that r<R and, preferably, $r/R \leq \frac{1}{2}$.

In the preferred embodiments of the present invention, the main resistance elements and the compensation elements are made of two different metals.

In a Wheatstone bridge type electrical circuit according to the present invention, the effect that differences in temperature between the branches of the bridge have on the output voltage is eliminated because of the compensation resistances each arranged in the thermal environment of a main resistance of one branch of the bridge but connected in series with the main resistance of an adjacent branch of the bridge. By using compensation elements having an ohmic value of resistance which is less than that of the main resistance elements, the loss of sensitivity of the Wheatstone bridge because of the introduction of these compensation elements is reduced.

A substantial reduction in the loss in sensitivity of the Wheatstone bridge is obtained if the ohmic value of the resistance, r, of the compensation elements is chosen to be a half of the ohmic value of the resistance, R, of the main resistance element. In such a case, sensitivity of the Wheatstone bridge is reduced only by 25%. However, it is preferable to use compensation elements having an ohmic value resistance according to the relationship $r/R \leq \frac{1}{10}$, in order to maintain the loss of sensitivity below 5% which can thus be considered to be negligible.

In view of the fact that the relationship $R\alpha = r\beta$ must be respected in the circuits according to the present invention, the use of compensation elements having a reduced ohmic value of resistance, r, goes hand in hand with the choice of a material having a high temperature coefficient of resistance, $\beta$, for making these compensation elements. Compensation elements in Nickel ($\beta = 4 \times 10^{-3}$/° C.) are particularly appropriate in this regard.

The present invention also provides a pressure sensor having strain gauges and comprising such a Wheatstone bridge type electrical circuit including compensation elements, the strain gauges constituting the main resistances of the bridge.

A pressure sensor of this type is protected against disturbances in the output voltage due to temperature differences existing between the strain gauges and, because the ohmic value of resistance of the compensation elements is low compared with that of the strain gauges, the sensor maintains good sensitivity.

Other features and advantages of the present invention will be better understood from the following description of embodiments thereof, given by way of example, and referring to the accompanying drawings in which:

FIG. 2 shows the construction of a pressure sensor having strain gauges, in which:

Figure 1:
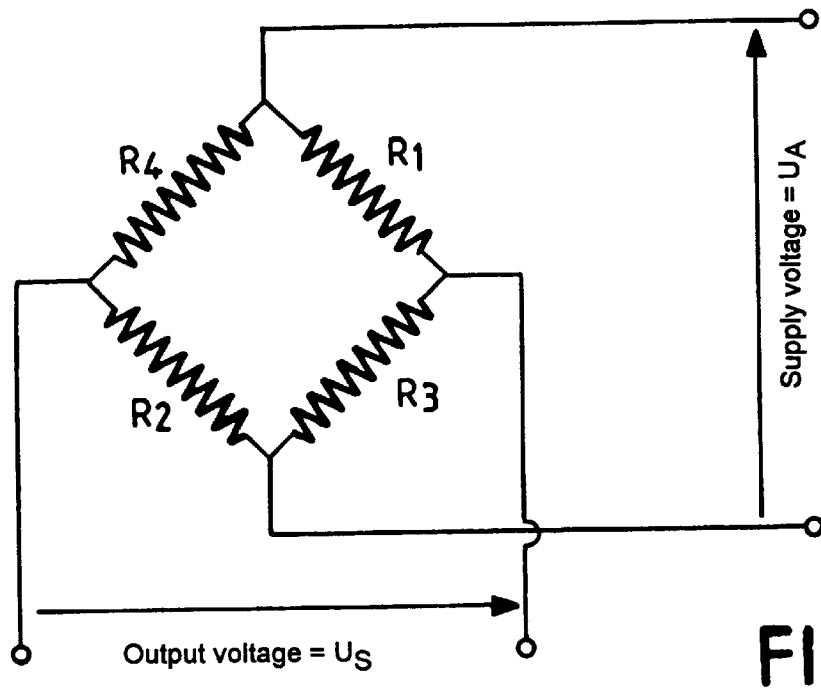
FIG. 1 is a diagram showing the typical structure of a Wheatstone bridge type electrical circuit.
Figure 3:
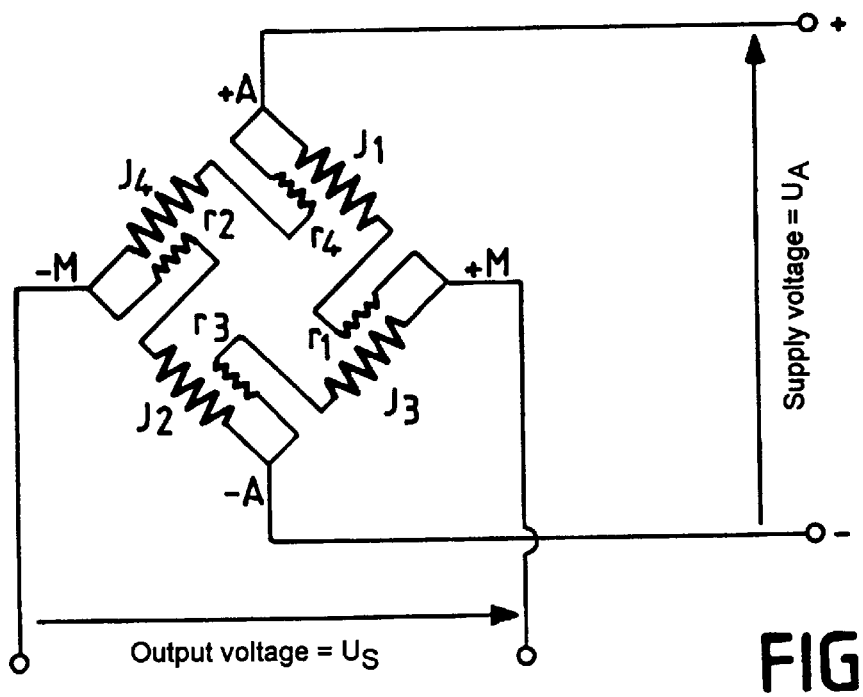
Figure 2A:
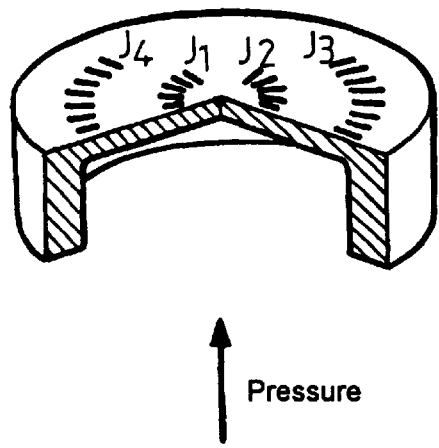
Figure 2B:
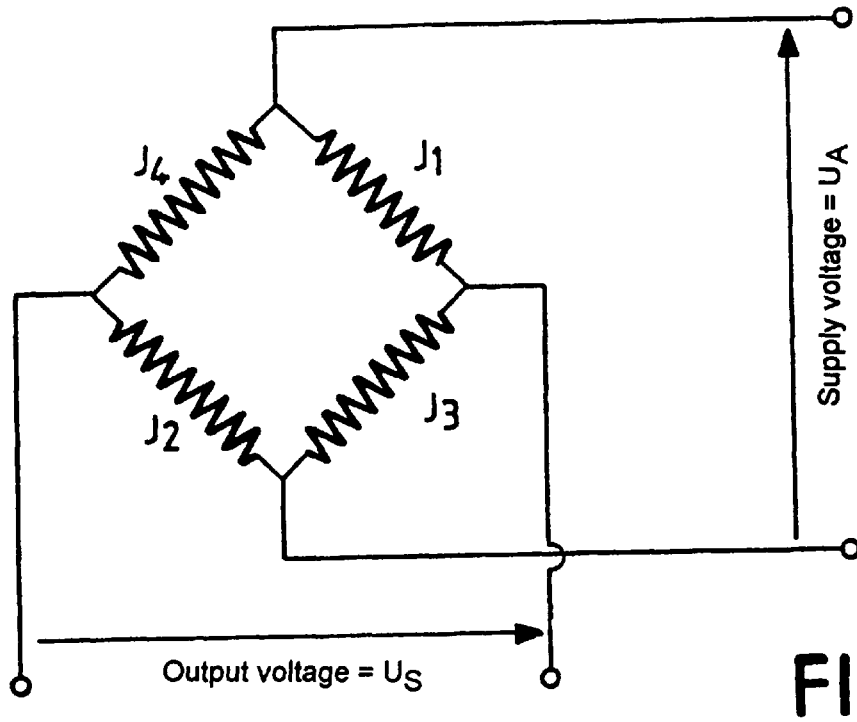
Figure 4:
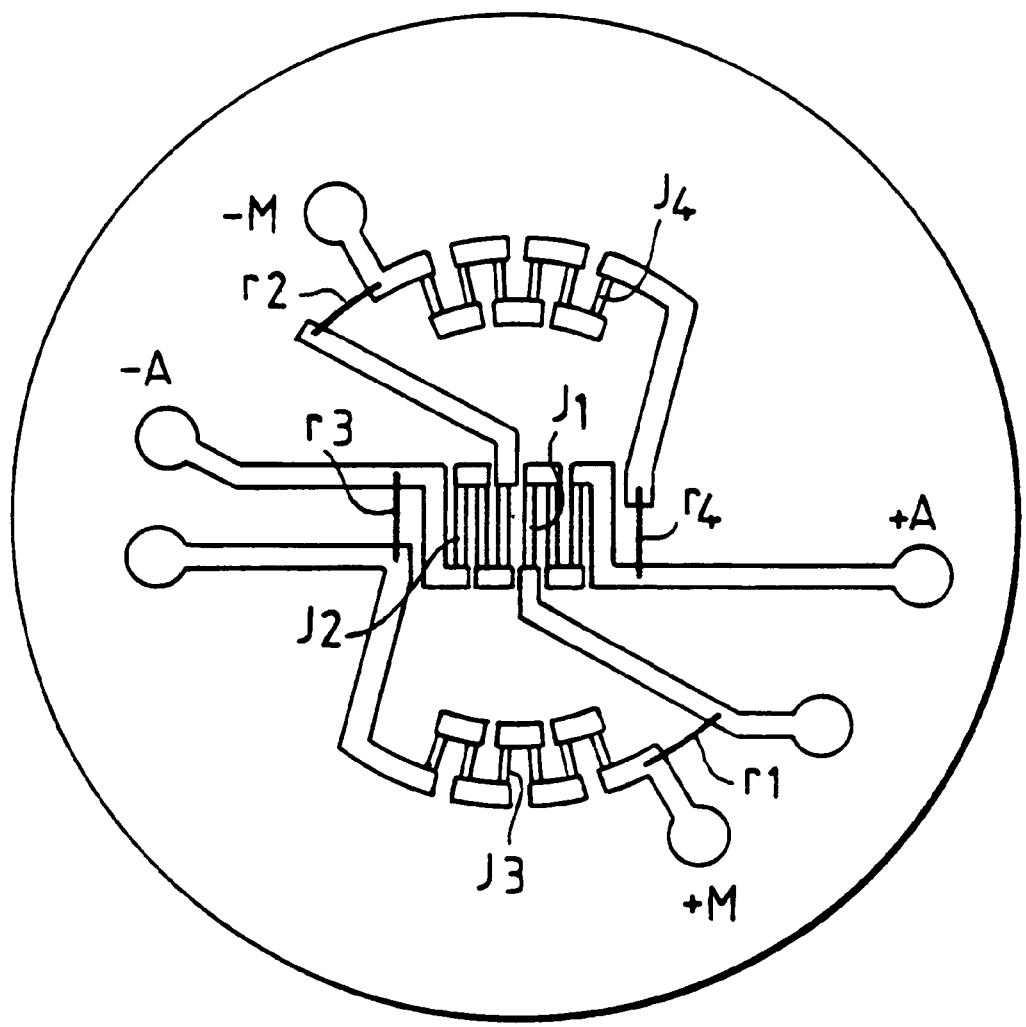
Figure 5:
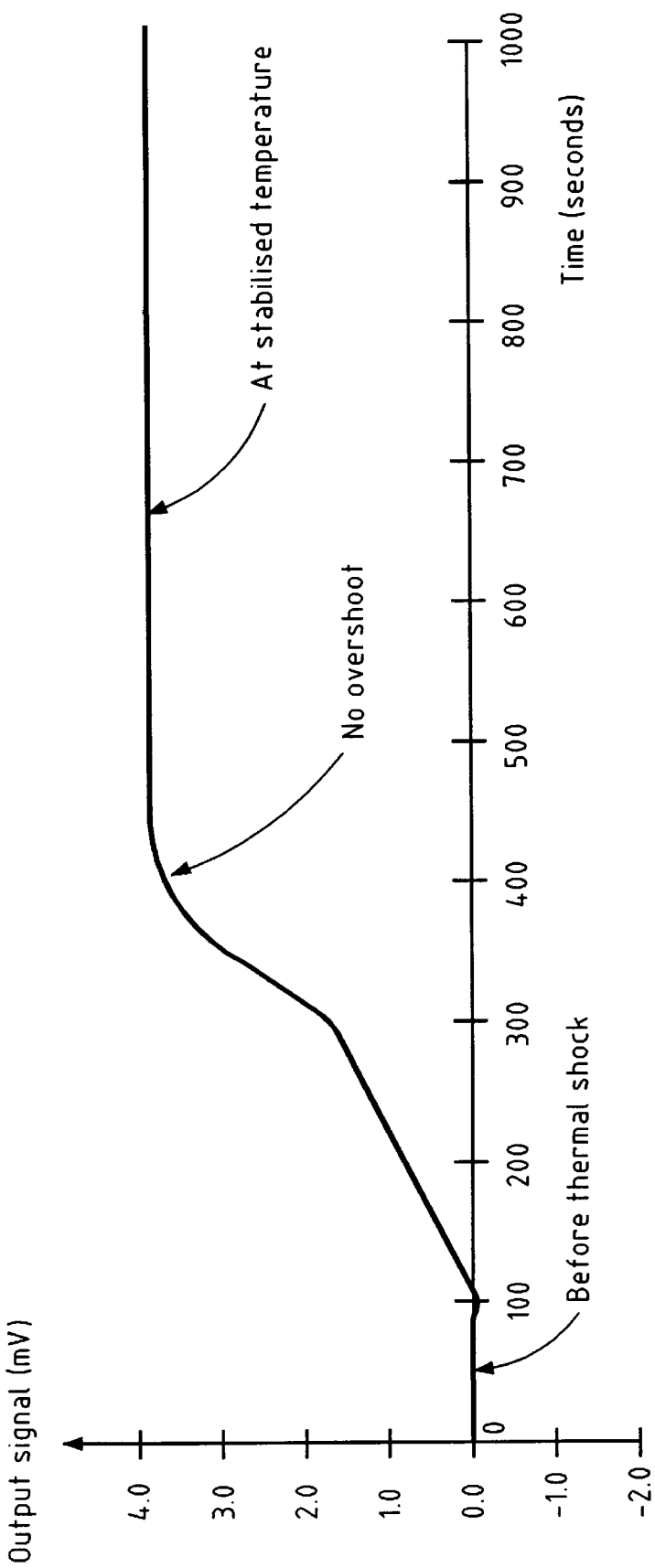
Figure 6:
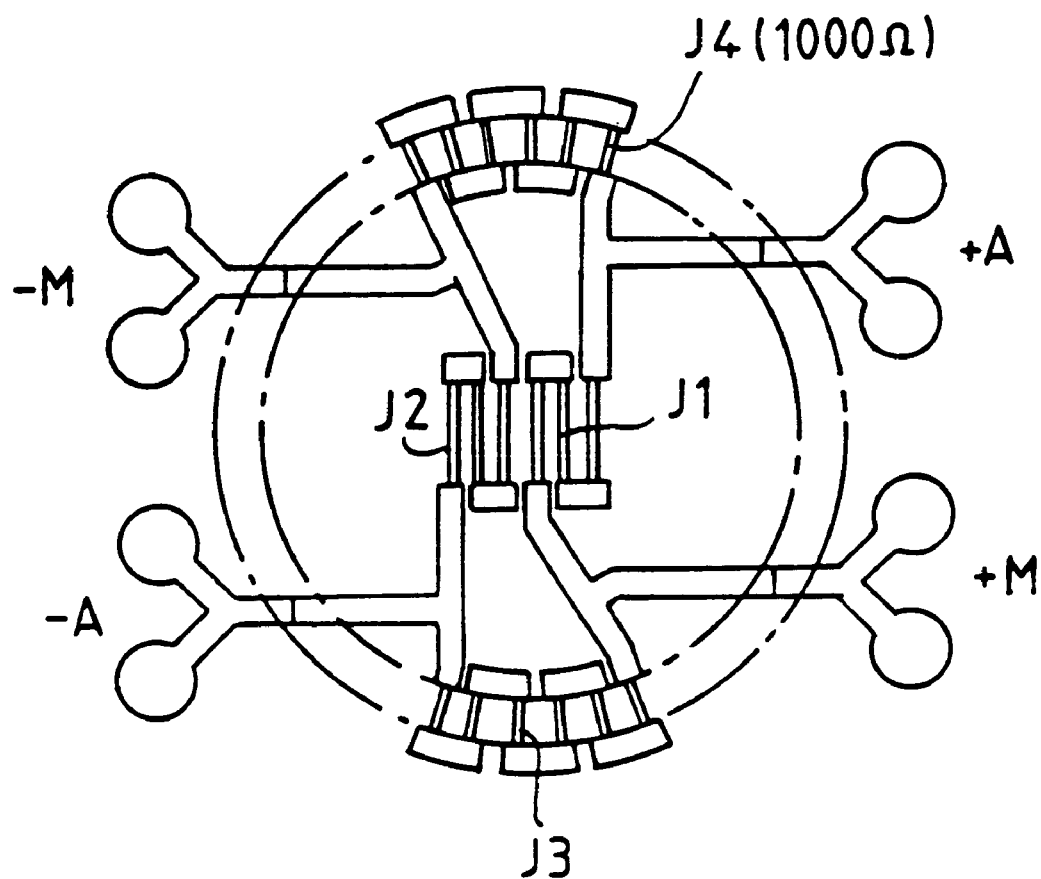
Figure 7:
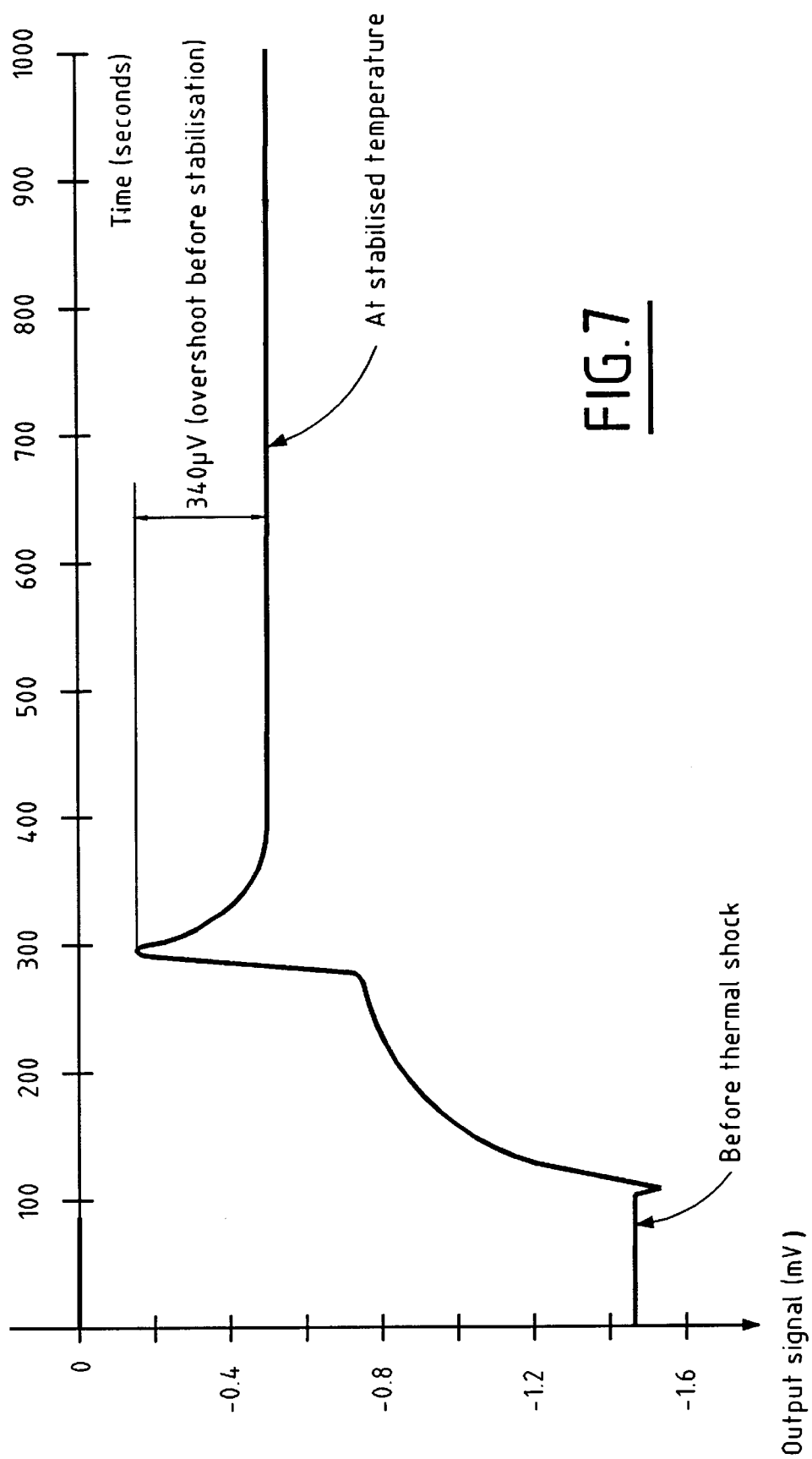

FIG. 2(a) indicates the physical disposition of the strain gauges on a simple membrane, and FIG. 2(b) shows the electrical circuit including these gauges;

FIG. 3 is a circuit diagram representing a Wheatstone bridge type electrical circuit according to a preferred embodiment of the present invention;

FIG. 4 is a plan view showing the physical disposition of strain gauges and compensation resistances in an example of a pressure sensor according to the present invention, manufactured by deposit of thin films on a membrane;

FIG. 5 is a graph indicating how the output signal of the FIG. 4 sensor varies in the case of a thermal shock;

FIG. 6 is a plan view showing, for purposes of comparison, a sensor similar to that of FIG. 4 but lacking compensation resistances; and FIG. 7 is a graph indicating, for comparison purposes, how the output signal of the FIG. 6 sensor varies in case of thermal shock.

The principle of the present invention will now be described, with reference to FIG. 3, in the context of a Wheatstone bridge type circuit made up of the strain gauges of a pressure sensor.

FIG. 3 is a circuit diagram showing a Wheatstone bridge type electrical circuit formed of the four usual strain gauges $J_1$ to $J_4$ of a pressure sensor and four compensation resistances $r_1$ to $r_4$. A compensation resistance $r_i$ is included in each branch of the bridge, in series with one of the strain gauges $J_i$, but it is physically located close to another strain gauge situated in one of the two adjacent branches. Thus, each strain gauge shares its thermal environment with a compensation resistance connected in a neighbouring branch of the Wheatstone bridge. The supply voltage is supplied between the points +A and −A and the output voltage is sensed between the points +M and −M.

In a pressure sensor, the ohmic values, $R_i$, of the strain gauges $J_i$, and their respective temperature coefficients of resistance, $\alpha_i$, are very close to one another; so close that one can designate the resistance of each gauge at a reference temperature by a common value, R, and their temperature coefficient of resistance by a common value, $\alpha$. The compensation resistances $r_i$ are selected, in their turn, to have a common ohmic value of resistance, r, and a common temperature coefficient of resistance, $\beta$.

In the case where the TCR, a, of the strain gauges is not so low as to be negligible, and the respective temperatures of the strain gauges vary from a reference value by amounts $\theta_i$, the output voltage $U_S$ of the circuit is given by equation (5) below:

$$U_S = U_A \frac{A_1 A_2 - A_3 A_4}{(A_1 + A_3)(A_2 + A_4)} \quad (5)$$

and:

$$A_1 = (R + \Delta R)(1 + \alpha\theta_1) + r(1 + \beta\theta_3),$$

$$A_2 = (R + \Delta R)(1 + \alpha\theta_2) + r(1 + \beta\theta_4),$$

$$A_3 = (R - \Delta R)(1 + \alpha\theta_3) + r(1 + \beta\theta_2), \text{ et}$$

$$A_4 = (R - \Delta R)(1 + \alpha\theta_4) + r(1 + \beta\theta_1).$$

(the supply voltage $U_A$ and the pressure being fixed).

According to the present invention, the ohmic value, r, of the compensation resistances is selected respecting the relationship below:

$$R\alpha = r\beta \quad (6)$$

In this case, even if differences exist between the temperatures of the gauges making up the Wheatstone bridge, the output voltage no longer depends on these different temperatures. It is also necessary to set $r \leq R/2$ in order to limit the loss of sensitivity of the bridge circuit.

According to the present invention, the ohmic value, r, of the compensation resistances, $r_i$, is preferably selected to be as low as possible in relation to the ohmic value, R, common to the strain gauges $J_i$ (that is, r<<R), and the TCR, $\beta$, of the compensation resistances, $r_i$, is selected to be substantially greater than the TCR, $\alpha$, of the strain gauges $J_i$ (that is, $\alpha << \beta$).

In these conditions, equation (5) simplifies to equation (7) below:

$$U_S = U_A(\Delta R/R)(1 - r/2R) \quad (7)$$

Comparing equations (3) and (7) it will be seen that, in the case of a variation in the applied pressure, the output signal of a Wheatstone bridge including compensation elements is lower than that of a Wheatstone bridge which emits these elements. This corresponds to a loss in measurement sensitivity equal to r/2R. If the Ohmic value of resistance, r, of the compensation elements is selected to be equal to ½R, this loss in sensitivity becomes 25%, which may be considered tolerable in view of the immunity to temperature gradients which is obtained in return.

It is preferable to use compensation resistances having an ohmic value of resistance which is at the most equal to approximately ⅒ R (this requires a value of temperature coefficient of resistance for the compensation resistances of $\beta = 10\alpha$). In such a case, the sensitivity of the pressure sensor is scarcely affected by the presence in the circuit of the compensation resistances (the output voltage loses 5% of its value in relation to the case where no compensation resistances are provided and the bridge behaviour is ideal). This loss in sensitivity could be reduced still further by choosing the ohmic value of the compensation resistances yet lower in relation to the ohmic value of the strain gauges, for example by making r have a value which is, at the most, equal to 5% of R.

An example of the configuration of strain gauges $J_1$ to $J_4$ and of compensation resistances $r_1$ to $r_4$ on the membrane m of a pressure sensor according to the invention is shown in FIG. 4 (a plan view). This configuration can be produced by depositing thin films on the membrane. In this example, the strain gauges are made of Nickel-Chrome and each have resistance of 1000Ω and a temperature coefficient of resistance of $1 \times 10^{-4}/°$ C.; the compensation resistances are made of platinum and each have a resistance of 100Ω and a temperature coefficient of resistance of $1 \times 10^{-3}/°$ C.

The compensation resistances made of platinum can advantageously be replaced, in the embodiment shown in FIG. 4, by compensation resistances made of Nickel which has a temperature coefficient of resistance equal to $4 \times 10^{-3}/°$ C. This reduces to 1.25% the loss in sensitivity of the sensor.

In FIG. 5, the output signal of the FIG. 4 sensor is shown in the case where the latter experiences a thermal shock. FIG. 6 shows, for the purposes of comparison, a sensor similar to that of FIG. 4 but omitting the compensation resistances. FIG. 7 shows the output signal of the FIG. 6 sensor in the case of a thermal shock. A comparison of FIGS. 5 and 7 shows that, as well as being immunised to temperature gradients existing between its main resistances, the output signal of this sensor also has increased stability to thermal shock compared with conventional pressure sensors.

Although the principles of the present invention have been described in the context of pressure sensors having strain gauges, they can also be applied, generally, to any Wheatstone bridge type electrical circuit in which the four resistances have substantially the same ohmic value, R, and substantially the same temperature coefficient of resistance, $\alpha$.

What is claimed is:

1. A Wheatstone bridge electrical circuit comprising four main resistances ($J_1$ to $J_4$) each having substantially the same ohmic value, R, and substantially the same value of temperature coefficient of resistance, $\alpha$, a main resistance element being located in each branch of the Wheatstone bridge, wherein each branch of the Wheatstone bridge comprises a compensation element in series with the corresponding main resistance element, the compensation elements ($r_1$ to $r_4$) each having substantially the same ohmic resistance value, r, and substantially the same temperature coefficient of resistance, $\beta$, these values being related to those of the main resistance elements substantially according to the formula:

$$R\alpha = r\beta$$

and each of the main resistance elements sharing its thermal environment with a compensation element of one of the adjacent branches of the Wheatstone bridge, characterised in that r<R and, preferably, $r/R \leq \frac{1}{2}$.

2. An electrical circuit according to claim 1, characterised in that each compensation element shares the thermal environment of a main resistance element of an adjacent branch of the Wheatstone bridge by being physically located very close to this main resistance element.

3. An electrical circuit according to claim 1, characterised in that the ohmic value of resistance, r, of the compensation elements is very low in comparison with that, R, of the main resistance elements, and the temperature coefficient of resistance, $\beta$, of the compensation elements is significantly higher than that, $\alpha$, of the main resistance elements.

4. An electrical circuit according to claim 3, characterised in that the ohmic value of resistance, r, of the compensation elements is, at the most, 10% of the ohmic value of the main resistance elements.

5. An electrical circuit according to claim 1, characterised in that it forms part of a pressure sensor having strain gauges, the main resistance elements being constituted by the strain gauges ($J_1$ to $J_4$) of the sensor.

6. An electrical circuit according to claim 1, characterised in that the main resistance elements and the compensation elements are made of two different metals.

7. An electrical circuit according to claim 1, characterised in that the compensation elements are made of Nickel.

8. A pressure sensor having strain gauges, comprising four strain gauges ($J_1$ to $J_4$) disposed on a membrane and connected in a Wheatstone bridge configuration, the four strain gauges having substantially the same ohmic value, R, and substantially the same temperature coefficient of resistance, α, wherein each branch of the Wheatstone bridge comprises a compensation element in series with the corresponding strain gauge, the compensation elements ($r_1$ to $r_4$) each having substantially the same ohmic value of resistance, r, and substantially the same temperature coefficient of resistance, β, these values being related to those of the strain gauges substantially according to formula:

$$R\alpha = r\beta$$

and each of the strain gauges sharing its thermal environment with a compensation element of one of the adjacent branches of the Wheatstone bridge, characterised in that r<R and, preferably, r/R≦½.

9. A pressure sensor according to claim 8, characterised in that each compensation element shares the thermal environment of a strain gauge of an adjacent branch of the Wheatstone bridge by being physically disposed very close to this gauge.

10. A pressure sensor according to claim 8, characterised in that the ohmic value of resistance, r, of the compensation elements is very low in comparison with that, R, of the strain gauges, and the temperature coefficient of resistance, β, of the compensation elements is significantly higher than that, α, of the strain gauges.

11. A pressure sensor according to claim 10, characterised in that the ohmic value of resistance, r, of the compensation elements is, at the most, 10% of the ohmic value of the strain gauges.

12. A pressure sensor according to claim 8, characterised in that the main resistance elements and the compensation elements are made of two different metals.

13. A pressure sensor according to claim 8, characterised in that the compensation elements are made of Nickel.

14. An electrical circuit according to claim 2, characterized in that:

the ohmic value of resistance, r, of the compensation elements is very low in comparison with that, R, of the main resistance elements, and the temperature coefficient of resistance, β, of the compensation elements is significantly higher than that, α, of the main resistance elements;

the ohmic value of resistance, r, of the compensation elements is, at the most, 10% of the ohmic value of the main resistance elements;

the electrical circuit forms part of a pressure sensor having strain gauges, the main resistance elements being constituted by the strain gauges ($J_1$ to $J_4$) of the sensor;

the main resistance elements and the compensation elements are made of two different metals; and the compensation elements are made of Nickel.

15. A pressure sensor according to claim 9, characterized in that:

the ohmic value of resistance, r, of the compensation elements is very low in comparison with that, R, of the strain gauges, and the temperature coefficient of resistance, β, of the compensation elements is significantly higher than that, α, of the strain gauges;

the ohmic value of resistance, r, of the compensation elements is, at the most, 10% of the ohmic value of the strain gauges;

the main resistance elements and the compensation elements are made of two different metals; and the compensation elements are made of Nickel.

* * * * *

UNITED STATES PATENT AND TRADEMARK OFFICE
CERTIFICATE OF CORRECTION

PATENT NO. : 6,098,464
APPLICATION NO. : 09/077769
DATED : August 8, 2000
INVENTOR(S) : Jean-Bernard Avisse et al.

It is certified that error appears in the above-identified patent and that said Letters Patent is hereby corrected as shown below:

On the title page item (54) and Col. 1, line 1, "WHEATSTONE BRIDGE WITH TEMPERATURE GRADIENT COMPENSATION" should read --WHEATSTONE BRIDGE WITH COMPENSATION FOR A TEMPERATURE GRADIENT BETWEEN THE MAIN RESISTANCES OF THE BRIDGE AND APPLICATION THEREOF IN A PRESSURE SENSOR HAVING STRAIN GAUGES--;

Column 2, Eq. 3, line 21, "($\Delta R/R$)" should read -- $\left(\dfrac{\Delta R}{R}\right)$ --;

Column 4, line 57, "a" should read --$\alpha$--;

Column 5, Eq. 7, line 30, "($\Delta R/R$) (1-r/2R)" should read -- $\left(\dfrac{\Delta R}{R}\right)\left(1-\dfrac{r}{2R}\right)$ --;

Column 6, claim 1, line 22, "circuit comprising" should read --circuit having four branches, comprising--;

Column 6, claim 1, line 23, "having substantially" should read --having the--;

Column 6, claim 1, line 24, "and substantially" should read --and the--;

Column 6, claim 1, lines 26 and 27, "branch of the Wheatstone bridge, wherein" should read --branch, wherein--;

Column 6, claim 1, line 27, "branch of the Wheatstone bridge" should read --branch comprises--;

Column 6, claim 1, line 30, "having substantially" should read --having the--;

Column 6, claim 1, line 31, "and substantially" should read --and the--;

Column 6, claim 1, line 37, "its" should read --a--;

Column 6, claim 8, line 67, "configuration, the" should read --configuration having four branches, the--;

Column 7, claim 8, line 1, "having substantially" should read --having the--;

Column 7, claim 8, line 2, "substantially the" should read --the--;

UNITED STATES PATENT AND TRADEMARK OFFICE
CERTIFICATE OF CORRECTION

PATENT NO. : 6,098,464
APPLICATION NO. : 09/077769
DATED : August 8, 2000
INVENTOR(S) : Jean-Bernard Avisse et al.

It is certified that error appears in the above-identified patent and that said Letters Patent is hereby corrected as shown below:

Column 7, claim 8, line 3, "branch of the Wheatstone bridge" should read --branch comprises--;

Column 7, claim 8, line 6, "having substantially" should read --having the--;

Column 7, claim 8, line 7, "and substantially" should read --and the--; and

Column 7, claim 8, line 13, "its" should read --a--.

Signed and Sealed this

Twenty-second Day of May, 2007

JON W. DUDAS
*Director of the United States Patent and Trademark Office*